United States Patent [19]
Takahi et al.

[11] Patent Number: 5,893,737
[45] Date of Patent: Apr. 13, 1999

[54] METHOD FOR MANUFACTURING SEMICONDUCTOR MEMORY DEVICE

[75] Inventors: Mitsuhiro Takahi, Tenri; Koji Fujimoto, Ikoma, both of Japan

[73] Assignee: Sharp Kabushiki Kaisha, Osaka, Japan

[21] Appl. No.: 08/636,697

[22] Filed: Apr. 23, 1996

[30] Foreign Application Priority Data

Apr. 26, 1995 [JP] Japan .................................. 7-102235
Mar. 13, 1996 [JP] Japan .................................. 8-055914

[51] Int. Cl.$^6$ ................................................. H01L 21/8246
[52] U.S. Cl. ............................ 438/275; 438/238; 438/199
[58] Field of Search ........................................ 438/258, 241, 438/275, 238-256, 386-399, 199

[56] References Cited

U.S. PATENT DOCUMENTS 5,589,415 12/1996 Blanchard .
5,679,598 10/1997 Yee .
5,716,875 2/1998 Jones, Jr. et al. ........................ 438/3

FOREIGN PATENT DOCUMENTS

61-288464 4/1986 Japan .

*Primary Examiner*—Jey Tsai
*Attorney, Agent, or Firm*—Nixon & Vanderhye, P.C.

[57] ABSTRACT

A method for manufacturing a semiconductor device comprising a first conductivity type semiconductor substrate, a memory cell region and a peripheral circuit region formed on the substrate, the memory cell region and the peripheral circuit region having a plurality of second conductivity type transistors (Tr's), which comprises the steps of:(i-a) forming source/drain regions in a memory cell formation region (MCFR) on the substrate by implanting a second conductivity type impurity, (ii-a) forming a gate insulating film and gate electrodes on the MCFG and a peripheral circuit formation region (PCFR) of the substrate, thereby providing the plurality of second conductivity type Tr's in the MCFG, (iii-a) implanting a first conductivity type impurity into the entire surface of the substrate with the gate electrodes used as a mask to form a device isolation region in the MCFG and, at the same time, to allow the first conductivity type impurity to be contained to a predetermined depth in a second conductivity type Tr formation region of the PCFR, and (iv-a) forming a mask pattern on the MCFR for masking the MCFR, and implanting a second conductivity type impurity to a predetermined depth into the second conductivity type Tr formation region of the PCFR with the mask pattern and the gate electrode used as a mask to form second conductivity type source/drain regions.

15 Claims, 4 Drawing Sheets

METHOD FOR MANUFACTURING SEMICONDUCTOR MEMORY DEVICE

BACKGROUND OF THE INVENTION

1. Field of the Invention

The present invention relates to a method for manufacturing a semiconductor device, and more particularly to a method for manufacturing a Read Only Memory (ROM) of a flat cell type.

2. Description of the Related Arts

Conventional masked ROMs for writing and utilizing diverse program information have a structure which uses a flat cell configuration in memory cell regions for an improvement of integration and which includes a LOCOS oxide film formed for device isolation in peripheral circuit regions. Generally, an N-MOS transistor is used as a memory cell transistor, and a complementary MOS transistor comprising an N-MOS transistor and a P-MOS transistor is used as a peripheral circuit.

Figure 5:
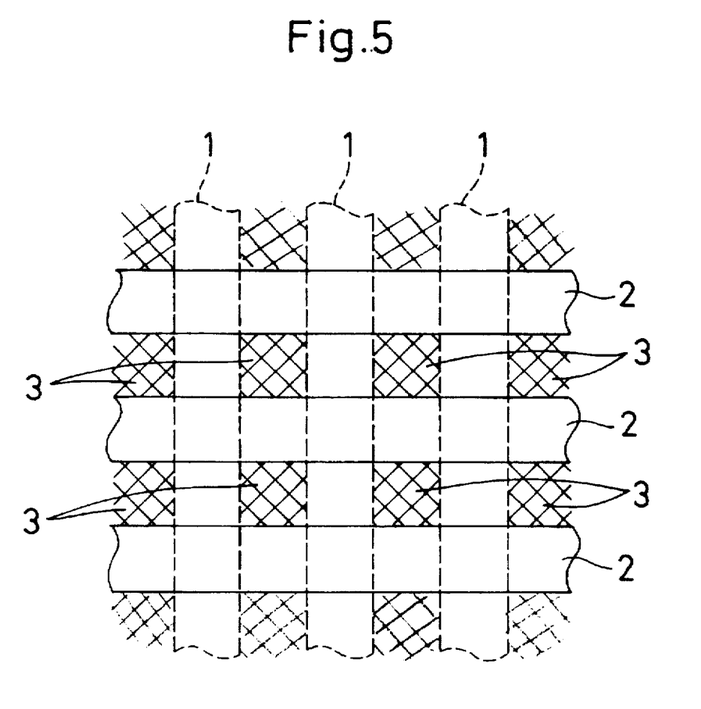
FIG. 5 is a plan view showing a masked ROM of a flat cell type.

In memory cell regions of a flat cell type, a plurality of source/drain regions 1 serving as bit lines for memory cell transistors are disposed parallel to each other with predetermined spacing, and a plurality of gate electrodes 2 serving as word lines are disposed parallel to each other with predetermined spacing on a gate insulation film so that the gate electrodes intersect the source/drain regions 1, as shown in FIG. 5. Afterwards, impurities of the same conductivity type as in the semiconductor substrate are introduced for device isolation between the memory cell transistors with the gate electrodes used as a mask, thus forming device isolation regions 3. FIG. 5 is a plan view of memory cell transistors of a flat cell type.

However, difficulties arise in forming peripheral circuit regions by applying a flat cell configuration similar to the one for the memory cell regions. Since flat cell structures involve formation of source/drain regions prior to forming gate electrodes, it is not possible, in peripheral circuit regions having a different transistor layout, to form source/drain regions in a self-aligned configuration with respect to gate electrodes of the transistor, so that an alignment shift must be considered, leading to increased LSI chip size.

When the LSI is constructed for 5 V power supply, although device isolation of the above flat cell configuration is possible in the memory cell regions by reducing the driving voltage, a LOCOS method of selective oxidation technique is used for device isolation so as to prevent decrease in field inversion voltage between the elements in the peripheral circuit.

The conventional method of manufacturing a masked ROM of a flat cell type will be explained hereinbelow with use of FIGS. 6(a) to 6(d), which are diagrams illustrating the conventional steps in manufacturing a masked ROM of a flat cell type.

Figure 6A:
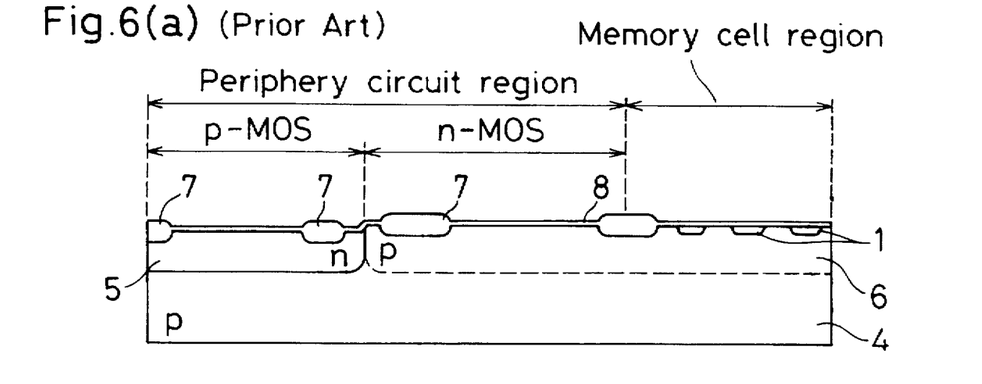
FIG. 6(a) to FIG. 6(d) are views illustrating the manufacturing steps of a conventional masked ROM of a flat cell type.

As shown in FIG. 6(a), an n-type impurity well region 5 and a p-type impurity well region 6 are first formed on a p-type silicon substrate 4 (having a concentration of about $5 \times 10^{14}$ to $2 \times 10^{15}$ cm$^{-3}$). Here, surface concentration of the two well regions is about $10^{17}$ cm$^{-3}$.

Then, a LOCOS oxide film 7 is formed for device isolation in the peripheral circuit region and, after an ion implantation (in a dose of about $10^{12}$ to $10^{13}$ cm$^{-2}$) for threshold voltage control, an n-type impurity is implanted at a high concentration to form source/drain regions 1 in the memory cell region.

Figure 6B:
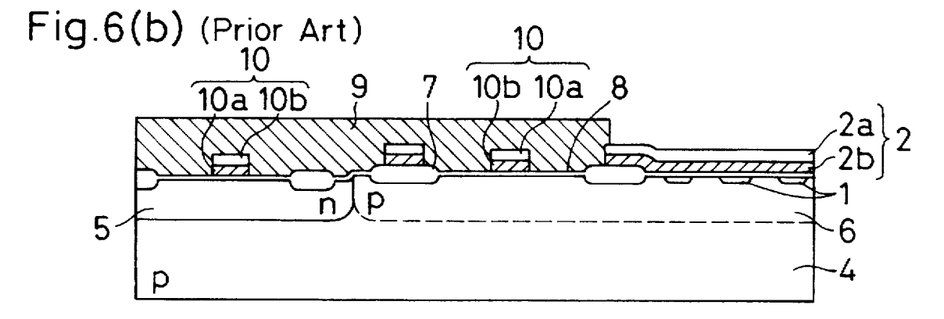

Next, a gate electrode 2 for the memory cell region and a gate electrode 10 for the peripheral circuit region are formed, as shown in FIG. 6(b). Here, the gate electrodes 2 and 10 are wired in a polycide structure, in which the symbols 2a and 10a represent films of a high melting point metal or a silicide thereof whereas the symbols 2b and 10b represent polysilicon films.

Further, with the peripheral circuit regions masked by a resist pattern 9, a p-type impurity for device isolation is implanted into the memory cell regions in a dose of about $10^{13}$ to $10^{14}$ cm$^{-2}$. Although FIG. 6(b) does not show the device isolation regions 3 in FIG. 5, a p-type impurity is implanted between the gate electrodes of the memory cell region. At this time, the impurity is also introduced into the source/drain regions 1. However, the source/drain regions 1 remain n$^+$-type because they are high concentration n-type impurity regions.

Figure 6C:
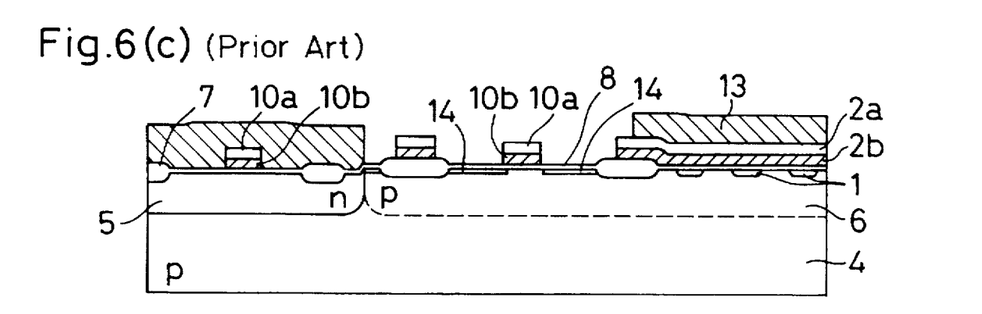

After the resist pattern 9 is removed, a resist pattern 13 is formed which is open at a portion of the peripheral circuit region whose source/drain regions will become an n-type transistor, as shown in FIG. 6(c). With this pattern used as a mask, an n-type impurity is implanted in a dose of about $3 \times 10^{13}$ cm$^{-2}$ to form an n$^-$ region 14. This n$^-$ region 14 will become a low concentration region of an LDD structure.

Subsequently, the resist pattern 13 is removed. After this, a resist pattern (not shown) is formed which is open at a portion of the peripheral circuit region whose source/drain regions will become a p-type transistor. With this pattern used as a mask, a p-type impurity is implanted in a dose of about $3 \times 10^{13}$ cm$^{-2}$ to form a p$^-$ region 11. This p$^-$ region 11 will become a low concentration region of an LDD structure.

Figure 6D:
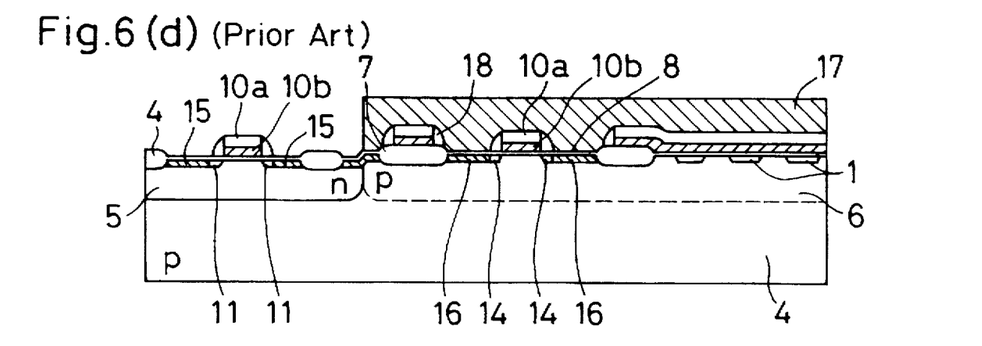

Next, the resist pattern is removed and sidewall spacers 18 are formed on the side walls of the gate electrodes, as shown in FIG. 6(d). Then, a resist pattern (not shown) is again formed which is open at the portion of the peripheral circuit region whose source/drain regions will be the n-type transistor. With this pattern used as a mask, an n-type impurity is implanted in a dose of $10^{15}$ to $10^{16}$ cm$^{-2}$ to form the source/drain regions 16. Further, a resist pattern 17 is formed which is open at the portion of the peripheral circuit region whose source/drain regions will be the p-type transistor. With this pattern used as a mask, a p-type impurity is implanted in a dose of $10^{15}$ to $10^{16}$ cm$^{-2}$ to form the source/drain regions 15.

Afterwards, an impurity is implanted into predetermined memory cell transistors to vary threshold voltages, thereby writing data as program information. This completes the intended masked ROM.

Here, the source/drain regions and the low concentration regions may not be formed in the above processing order. Either of the P-MOS transistor and the N-MOS transistor may be formed first. Also, the P-MOS transistor may not comprise a low concentration region due to its characteristics. In such a case, the process of forming the low concentration region is omitted from the above process. Further, the peripheral circuit region may comprise only an N-MOS transistor.

In the above process, when an impurity having the same conductivity type as that of the semiconductor substrate is introduced for device isolation between the memory cell transistors, the impurity for the device isolation must be implanted only into the memory cell region by using a photomask such as the resist pattern 9 on the peripheral circuit region, as shown in FIG. 6(b).

This is due to the following reason. When the impurity for device isolation in the memory cell region is also introduced into the low concentration source/drain regions functioning as the LDD structures for preventing the generation of hot carries in the transistors of the peripheral circuit region, and if the source/drain regions of a transistor in the peripheral circuit region have the same conductivity type as that of the source/drain regions in the memory cell transistor, the conductivity type of the low concentration source/drain regions in the transistor of the peripheral circuit region will be lost because the above impurity for device isolation has a different conductivity type from that of the impurity in the low concentration source/drain regions and has a similar degree of concentration. This leads to degradation in the saturation drain current of the transistor and in the device characteristics such as decrease in junction breakdown voltage. Therefore, a photomask is used which is necessary for masking the peripheral circuit region when the impurity is introduced for forming the device isolation in the memory cell region.

After the formation of the gate electrodes and before the formation of the source/drain regions 15 and 16 in FIG. 6(d), the conventional method needs five photolithography steps and five impurity implantation steps for device isolation of the memory cell region, n⁻ implantation, p⁻ implantation (if the p-MOS transistor also is to have LDD structures), n⁺ implantation, and p⁺ implantation.

Here, if the p-MOS transistor is not to have LDD structures, there will be needed four photolithography steps and four impurity implantation steps.

It is essential to reduce the number of photomasks used in manufacturing LSIs in view of lowering the costs and improving the yield by simplifying the process. However, a simple reduction of the number of photomasks will cause variance in LSI characteristics and will invite degradation of the quality.

SUMMARY OF THE INVENTION

The present invention provides a first method for manufacturing a semiconductor device comprising a first conductivity type semiconductor substrate, a memory cell region formed on the substrate, the memory cell region having a plurality of second conductivity type transistors, and a peripheral circuit region formed on the substrate, the peripheral circuit region having at least a plurality of second conductivity type transistors, which comprises the steps of:

(i-a) forming source/drain regions in a memory cell formation region on the semiconductor substrate by implanting a second conductivity type impurity, (ii-a) forming a gate insulating film and gate electrodes on the memory cell formation region and a peripheral circuit formation region of the semiconductor substrate, thereby providing the plurality of second conductivity type transistors in the memory cell formation region, (iii-a) implanting a first conductivity type impurity into the entire surface of the semiconductor substrate with the gate electrodes used as a mask to form a device isolation region in the memory cell formation region and, at the same time, to allow the first conductivity type impurity to be contained to a predetermined depth in a second conductivity type transistor formation region of the peripheral circuit formation region, and (iv-a) forming a mask pattern on the memory cell formation region for masking the memory cell formation region, and implanting a second conductivity type impurity to a predetermined implantation depth into the second conductivity type transistor formation region of the peripheral circuit formation region with the mask pattern and the gate electrode used as a mask to form second conductivity type source/drain regions, the step (iv-a) being performed before or after the step of (iii-a), thereby providing the plurality of second conductivity type transistors in the second conductivity type transistor formation region of the peripheral circuit formation region.

Also, the present invention provides a second method for manufacturing a semiconductor device comprising a semiconductor substrate having first and second conductivity type regions formed therein, a memory cell region formed on the substrate, the memory cell region having a plurality of second conductivity type transistors, and a peripheral circuit region formed on the substrate, the peripheral circuit region having a plurality of first conductivity type transistors, which comprises the steps of:

(i-b) forming source/drain regions in a memory cell formation region on the semiconductor substrate by implanting a second conductivity type impurity, (ii-b) forming a gate insulating film and gate electrodes on the memory cell formation region and a peripheral circuit formation region of the semiconductor substrate, thereby providing the plurality of second conductivity type transistors in the memory cell formation region, (iii-b) implanting a first conductivity type impurity into the entire surface of the semiconductor substrate with the gate electrode used as a mask to form a device isolation region in the memory cell formation region and to form a first conductivity type impurity region in at least a first conductivity type transistor formation region of the peripheral circuit formation region.

The purpose of the present invention, in view of the problems described above, is to provide a technique for reducing the number of steps for lowering the costs, improving the yield, and shortening the turn-around-time of the process without causing degradation in the device characteristics.

DETAILED DESCRIPTION OF THE PREFERRED EMBODIMENTS

The semiconductor device for the manufacturing methods of the present invention comprises a peripheral circuit and a memory cell of a flat cell type formed on a semiconductor substrate. The semiconductor substrate used for the methods is not specifically limited as long as it is one generally used as a substrate. However, a silicon substrate is preferably used. Preferably, the semiconductor substrate includes the peripheral circuit region in which a device isolation film is formed in advance by a known method such as the LOCOS method and the memory cell region. The semiconductor substrate is preferably doped in advance with impurities for the control of the threshold voltage.

In the first method for manufacturing a semiconductor device according to the present invention, the peripheral circuit comprises at least an N-MOS or a P-MOS transistor, and the memory cell comprises a transistor having the same conductivity type as that of the peripheral circuit.

In the step (i-a), source/drain regions are formed in the memory cell formation region on the semiconductor substrate. The source/drain regions may be formed by forming a mask pattern having a desired shape through, for example, photolithography and etching processes, or by implanting impurity ions having a different conductivity type from that of the semiconductor substrate using the mask pattern. The impurity ions may be implanted, for example, in a dose of $1 \times 10^{15}$ to $1 \times 10^{16}$ cm$^{-2}$ and at an implantation energy of 40 to 80 kev, depending on the condition and the process. Preferably, an annealing is conducted at a temperature of about 800 to 900° C. for about 1 to 3 hours after the implantation.

In the step (ii-a), a gate insulating film is formed on the memory cell formation region and on the peripheral circuit formation region of the semiconductor substrate. The gate insulating film may be formed by a known method such as thermal oxidation with the SiO$_2$ film having a thickness of about 14 to 17 nm. Then, gate electrodes having a desired shape are formed on the gate insulating film. The gate electrodes may be formed in a monolayer of polysilicon, silicide of a high melting point metal or the like, or in a multiple layer of polycide comprising a polysilicon and a silicide. The film thickness of the gate electrodes may be suitably adjusted depending on the material to be used and the like, but may preferably be about 300 to 400 nm. In the memory cell formation region, a plurality of gate electrodes are formed parallel to each other and intersecting with the previously formed source/drain regions. As a result, a plurality of second conductivity type transistors are formed in the memory cell formation region.

In the step (iii-a), a first conductivity type impurity is implanted into the entire surface of the semiconductor substrate with the gate electrodes formed in the above process used as a mask. By this ion implantation, a device isolation region is formed in the memory cell region and, at the same time, a first conductivity type impurity region is formed in a second conductivity type transistor formation region of the peripheral circuit formation region in the predetermine dose and depth, for example, in the same dose and the same implantation depth as that of the device isolation region. For instance, the driving voltage of the semiconductor device to be obtained is about 5 V or less and the distance between the source/drain regions in the memory cell region is about 0.6 μm, the impurity ions may be implanted in a dose of $1 \times 10^{12}$ to $1 \times 10^{14}$ cm$^{-2}$ at an implantation energy of about 30 keV if BF$_2$ is to be used.

In the step (iv-a), a mask pattern is formed on the memory cell formation region for masking the memory cell formation region and, with this mask pattern and the gate electrodes used as a mask, a second conductivity type impurity is implanted to a predetermined implantation depth into the second conductivity type transistor region of the peripheral circuit formation region. By this implantation, it is possible to form second conductivity type source/drain regions having a depth, for example, equal to or more than the depth of the device isolation region in the memory cell formation region. Here, the second conductivity type impurity must be implanted under an appropriate condition, e.g., implantation energy, a dose, a kind of ion and temperature of the substrate or ambience etc., such that the impurity contained in the first conductivity type impurity region may be canceled and, further, the region may indicate the second conductivity type. Specifically, the second conductivity type impurity is implanted in a dose of about $1 \times 10^{15}$ to $1 \times 10^{16}$ cm$^{-2}$ and at an implantation energy of about 40 keV if As is to be used. As a result, a plurality of second conductivity type transistor are formed in the peripheral circuit formation region.

So far, the explanation has been given for performing the above steps (iii-a) and (iv-a) in this order, but this invention includes a method of performing the steps (i-a), (ii-a) and (iv-a) in this order and subsequently performing the step (iii-a) In this case, a second conductivity type impurity region is formed in the second conductivity type transistor formation region of the peripheral circuit formation region in the step (iv-a) after the step(ii-a) by implanting a second conductivity type impurity in a dose which is about 100 times more than the dose of the first conductivity type impurity implanted in the next step (iii-a). Then, a first conductivity type impurity is implanted in the previously formed the second conductivity type impurity region, so that the first conductivity type impurity is canceled with the second conductivity type impurity, thereby forming the second conductivity impurity source/drain regions in the second conductivity type transistor formation region of the peripheral circuit formation region.

Subsequently, optional steps such as removal of the mask pattern, writing of a program information, formation of an interlayer insulation film, planarization, heat treatment and formation of wiring complete the semiconductor device.

In the above-mentioned first method for manufacturing a semiconductor device, the transistor in the peripheral circuit region may comprise an LDD structure. In such a case, with the mask pattern formed in the step (iv-a) and the gate electrodes used as a mask, a second conductivity type impurity is implanted into the first conductivity type impurity region formed in the peripheral circuit formation region in a dose of about $2 \times 10^{12}$ to $2 \times 10^{14}$ cm$^{-2}$ to convert the first conductivity type impurity region into a second conductivity type impurity region, followed by removal of the mask pattern.

Then, in the step (v-a), sidewall spacers are formed on the side walls of the gate electrodes. Here, the sidewall spacers may be formed by forming an SiO$_2$ film to a thickness of about 300 nm and subsequently conducting an anisotropic etching. Further, a mask pattern is again formed on the memory cell region and, with the mask pattern, the gate electrodes and the sidewall spacers used as a mask, a second conductivity type impurity is implanted in a dose of about $1 \times 10^{15}$ to $1 \times 10^{16}$ cm$^{-2}$ into the second conductivity type impurity region in the peripheral circuit region, thereby forming the second conductivity type impurity region with an LDD structure.

So far, the explanation has been given for performing the above steps (iii-a) and (iv-a) in this order and further performing the step (v-a), but it is possible to perform the steps (i-a), (ii-a), (iv-a) and (iii-a) in this order and subsequently perform the step (v-a). In this case, a second conductivity type impurity region is formed in the second conductivity type transistor region of the peripheral circuit region in the step (iv-a) after the step(ii-a) by implanting a second conductivity type impurity to a predetermined depth in a dose which is more than the dose of the first conductivity type impurity implanted in the next step (iii-a), and then a first conductivity type impurity is implanted in the previously formed second conductivity type impurity region, so that the first conductivity type impurity is canceled with the second conductivity type impurity, thereby forming a second conductivity type impurity region. Subsequently, the second conductivity type impurity is implanted into the second conductivity type impurity region in the step (v-a), thereby forming source/drain regions having an LDD structure.

In the above process, the dose and implantation energy of the first conductivity type impurity in the step (iii-a) and the dose etc of the second conductivity type impurity in the step (iv-a) have been specifically given, but they may not be limited to the above dose etc. Preferably, the second conductivity type source/drain regions are formed by implanting the second conductivity type impurity in a dose which is at least more than the dose of the first conductivity type impurity and to an implantation depth which is necessary for converting the conductivity type of the first conductivity type impurity region formed in the second conductivity type transistor region.

In the second method for manufacturing a semiconductor device according to the present invention, the transistors formed in the peripheral circuit formation region include at least a transistor having a different conductivity type from that of the transistor formed in the memory cell region. The peripheral circuit region may comprise a CMOS. The semiconductor substrate used herein preferably comprises a first conductivity type region and a second conductivity type region formed to have a surface concentration in the order of about $10^{17}$ cm$^{-3}$.

First, an explanation will be given for a case in which the peripheral circuit region comprises a first conductivity type transistor and the memory cell region comprises a second conductivity type transistor.

The steps (i-b) and (ii-b) may be conducted in the same manner as in the above steps (i-a) and (ii-a).

In the step (iii-b), a first conductivity type impurity is implanted into the entire surface of the semiconductor substrate. By this ion implantation, a device isolation region is formed in the memory cell formation region and, at the same time, a first conductivity type impurity region is formed in at least a first conductivity type transistor formation region of the peripheral circuit formation region in the predetermine dose and depth, for example, in the same dose and at the same implantation energy as that of the device isolation region. The first conductivity type impurity region may be used as low concentration source/drain regions when the first conductivity type transistor in the peripheral circuit region is to have an LDD structure. Preferably, conditions for the impurity implantation such as a dose, an implantation energy and a kind of impurity to be used may be essentially the same as those for the above step (iii-a).

The above process followed by subsequent steps of forming a mask pattern, forming sidewall spacers and ion implantation by a known method completes a semiconductor device in which the first conductivity type transistor in the peripheral circuit formation region has an LDD structure.

Second, an explanation will be given for a case in which the peripheral circuit region comprises a CMOS and the memory cell region comprises a second conductivity type transistor.

It is possible to conduct substantially the same step as the above step (iii-b) except that a mask pattern is formed on the second conductivity type transistor formation region of the peripheral circuit formation region, and that the mask pattern and the gate electrodes are used as a mask in the step (iii-b) (a).

Subsequently, a mask pattern is formed which is open only at the second conductivity type transistor formation region of the peripheral circuit formation region and a second conductivity type impurity is implanted with the mask pattern and the gate electrode used as a mask in the step (iii-b) (b).

By these steps, it is possible to form a first conductivity type impurity region in the first conductivity type transistor formation region of the peripheral circuit formation region and to form a second conductivity type impurity region in the second conductivity type transistor formation region of the peripheral circuit formation region. Here, either of the above steps (iii-b) (a) and (iii-b) (b) may be conducted first.

Alternatively, instead of conducting the steps (iii-b) (a) and (iii-b) (b), it is possible to conduct the step (iii-b) (c) explained hereinafter without formation of the mask pattern on the second conductivity type transistor formation region as the step (iii-b). Here, in this case also, either of the steps (iii-b) and (iii-b) (c) may be conducted first.

Namely, in the step (iii-b), by implanting a first conductivity type impurity into the entire surface of the semiconductor substrate, a device isolation region is formed in the memory cell formation region and a first conductivity type impurity region in the first conductivity type transistor formation region of the peripheral circuit formation region and, at the same time, a first conductivity type impurity region is formed also in the second conductivity type transistor formation region of the peripheral circuit formation region.

Subsequently, in the step (iii-b) (c), a mask pattern is formed which is open only at the second conductivity type transistor formation region of the peripheral circuit formation region and, with the mask pattern and the gate electrodes used as a mask, a second conductivity type impurity is implanted so as to convert the first conductivity type impurity region formed in the second conductivity type transistor formation region into a second conductivity type impurity region. By these steps, it is possible to form a first conductivity type impurity region in the first conductivity type transistor formation region of the peripheral circuit formation region and to form a second conductivity type impurity region in the second conductivity type transistor formation region of the peripheral circuit formation region.

Further, the following steps of (iv-b), (v-b) (d) and (v-b) (e) may be conducted after completing either the steps (iii-b) (a) and (iii-b) (b) or the steps of (iii-b) and (iii-b) (c). Here, either of the above steps (v-b) (d) and (v-b) (e) may be conducted first.

In the step (iv-b), sidewall spacers are formed on the side walls of the gate electrodes. The sidewall spacers may be formed in the same manner as in the step (v-a).

In the step (v-b) (d), a mask pattern is formed which is open only at the first conductivity type transistor formation region of the peripheral circuit formation region and with the mask pattern, the gate electrodes and the sidewall spacers used as a mask, a first conductivity type impurity region is formed into the first conductivity type impurity region in the first conductivity type transistor formation region.

In the step (v-b) (e), a mask pattern is formed which is open only at the second conductivity type transistor formation region of the peripheral circuit formation region and a second conductivity type impurity region is formed into the second conductivity type impurity region in the second conductivity type transistor formation region by following a step similar to the step (v-a). By these steps, it is possible to form first conductivity type source/drain regions with an LDD structure in the first conductivity type transistor formation region of the peripheral circuit formation region, and second conductivity type source/drain regions with an LDD structure in the second conductivity type transistor formation region of the peripheral circuit formation region.

All the above-described steps may be conducted substantially in the same manner as in the steps (i-a) to (v-a) or the steps similar to these (only with the difference in the conductivity type).

According to the above method for manufacturing a semiconductor device of the present invention, the implantation of impurity for forming the device isolation region in the memory cell region can be directly utilized for forming the impurity region in the peripheral circuit region. Moreover, if the resist pattern is not formed on the peripheral circuit region at the time of forming the device isolation region in the memory cell region, the conventionally needed photomask will be no longer needed. Therefore, the number of photolithography steps will be reduced, so that the manufacturing steps will be simplified, which will lead to reduction of costs.

Also, if the resist pattern is not formed at the time of forming the device isolation region in the memory cell region, the impurity is also introduced into the active regions of the peripheral circuit region where there are no overlapping gate electrodes and, therefore, an impurity having a different conductivity type from that of the impurity for device isolation must be introduced so as to cancel the impurity previously introduced into the transistor of the peripheral circuit region which has a channel having the same conductivity type as that of the transistor of the memory cell region and also to prevent degradation of the device characteristics. This introduction of the different conductivity type impurity can be performed simultaneously with the formation of the low concentration source/drain regions and the like in the peripheral circuit region, so that there will be no need for a new photomask.

EXAMPLES

The methods for manufacturing a semiconductor device according to the present invention will be detailed hereinafter in conjunction with the attached drawings, which are not intended to limit the scope of the present invention.

FIGS. 1(a) to (d) are views illustrating the manufacturing steps of an embodiment of the method for manufacturing a semiconductor device according to the present invention, in which the reference numeral 1 designates an n-type high concentration impurity region, 2 and 10 gate electrodes, 2a and 10a high melting point metal layers, 2b and 10b polysilicon layers, 4 a p-type silicon substrate, 5 an n-type impurity well region, 6 a p-type impurity well region, 7 a LOCOS oxide film, 8 a gate insulation film, 11 and 12 low concentration p-type impurity regions, 13 a resist pattern, 14 a low concentration n-type impurity region, 15 a high concentration p-type impurity region, 16 a high concentration n-type impurity region, and 18 a sidewall.

The manufacturing steps of an embodiment of the method for manufacturing a semiconductor device having a memory cell region of a flat cell type and a peripheral circuit region comprising a CMOS according to the present invention will hereinafter be detailed.

Figure 1A:
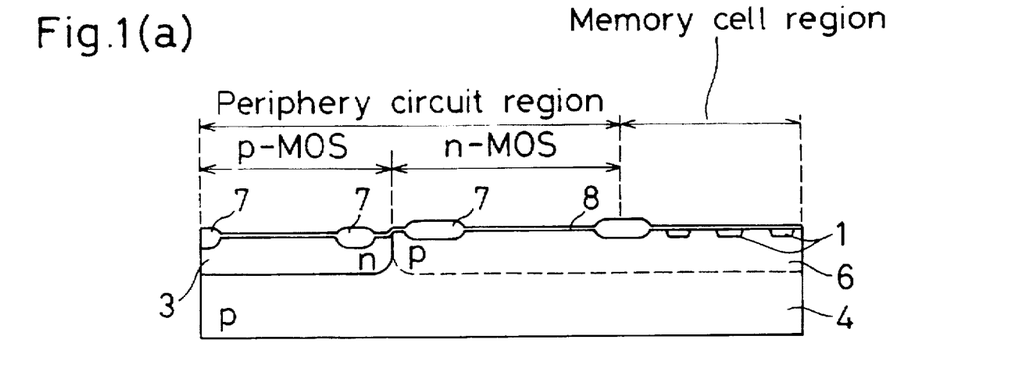
FIG. 1(a) to FIG. 1(d) are views illustrating the manufacturing steps of an embodiment of the method for manufacturing a semiconductor device according to the present invention.

First, an n-type impurity well region 5 and a p-type impurity well region 6 are each formed to have a surface impurity concentration of about $10^{17}$ $cm^{-3}$ on a p-type silicon substrate 4 and then a LOCOS oxide film 7 is formed for device isolation of the peripheral circuit region, as shown in FIG. 1(a). Subsequently, ions are implanted for threshold voltage control and a resist pattern (not shown) is formed on the p-type silicon substrate 4. With this resist pattern used as a mask, an n-type impurity such as arsenic is implanted into the flat-cell-type memory region (hereafter referred to as "a memory cell region") in a dose of about $1 \times 10^{15}$ to $1 \times 10^{16}$ $cm^{-2}$ to form a plurality of high concentration n-type impurity regions 1, which will be source/drain regions, parallel to each other with predetermined spacing. Then, a gate oxide film 8 is formed to a thickness of about 17 nm on the entire surface of the obtained silicon substrate 4.

Figure 1B:
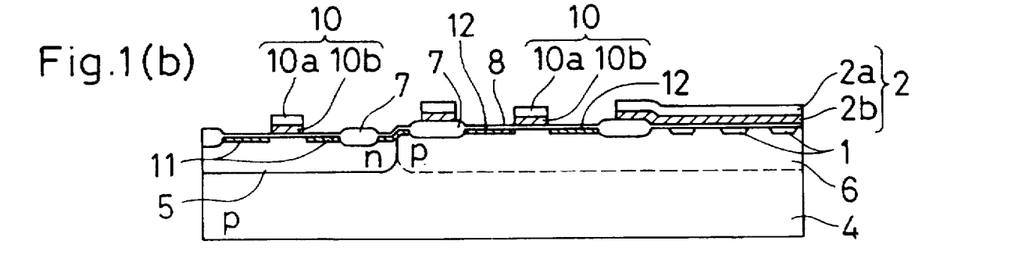

Next, gate electrodes 2 and 10 comprising, for example, a polycide are formed on the p-type silicon substrate 4, as shown in FIG. 1(b). Here, the gate electrodes 2 of the memory cell region are plurally formed parallel to each other with predetermined spacing so that the gate electrodes 2 intersect the n-type impurity regions 1.

Subsequently, a p-type impurity such as boron is implanted into the entire surface of the p-type silicon substrate 4 in a dose of about $1 \times 10^{12}$ to $1 \times 10^{14}$ $cm^{-2}$ if, for example, the driving voltage is about 3 V and the distance between the source/drain regions is about 0.6 µm, thereby forming a low concentration p-type impurity region 11 which will be the low concentration source/drain regions in the p-MOS region as well as forming a device isolation region comprising the p-type impurity in the memory cell region. At this time, a low concentration p-type impurity region 12 is formed also in the n-MOS region.

Figure 1C:
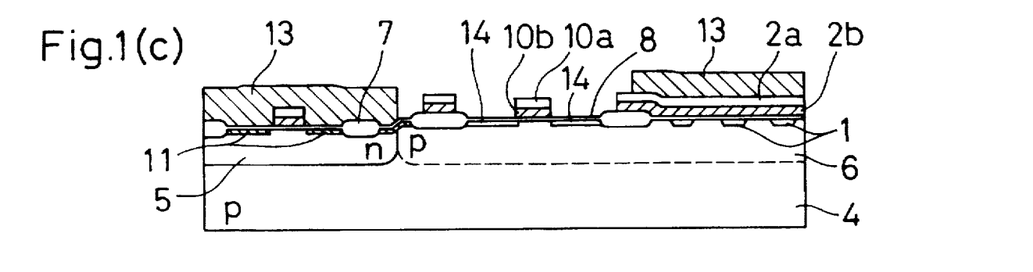

Next, a resist pattern 13 is formed which is open at the n-MOS region of the peripheral circuit region, as shown in FIG. 1(c). With this resist pattern 13 used as a mask, an n-type impurity such as phosphorus is implanted in a dose of about $1 \times 10^{12}$ to $2 \times 10^{14}$ $cm^{-2}$ to form a low concentration n-type impurity region 14 which will become low concentration source/drain regions. At this time, the n-type impurity is implanted in a dose which is about $1 \times 10^{12}$ to $1 \times 10^{14}$ $cm^{-2}$ more than a conventional amount of n-type impurity implantation (the extra amount being approximately the same as that of the previously implanted p-type impurity) to a depth equal to or more than the depth of the p-type impurity region 12, so as to cancel the p-type impurity in the low concentration p-type impurity region 12 formed in the n-MOS region and to prevent degradation of the device characteristics.

Figure 1D:
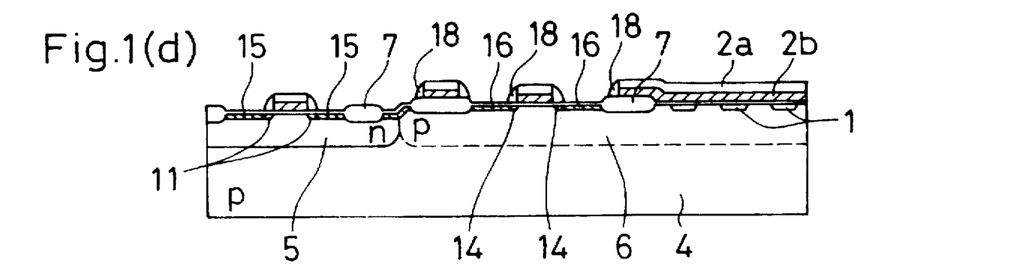

Further, the resist pattern 13 is removed, and sidewall spacers 18 are formed on the side walls of the gate electrode 10 as shown in FIG. 1(d). A resist pattern (not shown) is then formed so as to mask the substrate surface except the n-MOS region of the peripheral circuit region, and an n-type impurity such as arsenic is implanted into the n-MOS region in a dose of about $1 \times 10^{15}$ to $1 \times 10^{16}$ $cm^{-2}$ to form a high concentration p-type impurity region 15 which will be high concentration source/drain regions. A resist pattern (not shown) is then formed so as to mask the substrate surface except the p-MOS region of the peripheral circuit region, and a p-type impurity such as $BF_2$ is implanted into the p-MOS region in a dose of about $1 \times 10^{15}$ to $1 \times 10$ $cm^{-2}$ to form a high concentration n-type impurity region 16 which will be high concentration source/drain regions, thereby forming transistors having an LDD structure.

Afterwards, an impurity is implanted into predetermined memory cell transistors to vary threshold voltages, thereby writing data as program information. This completes the intended masked ROM.

Figure 2:
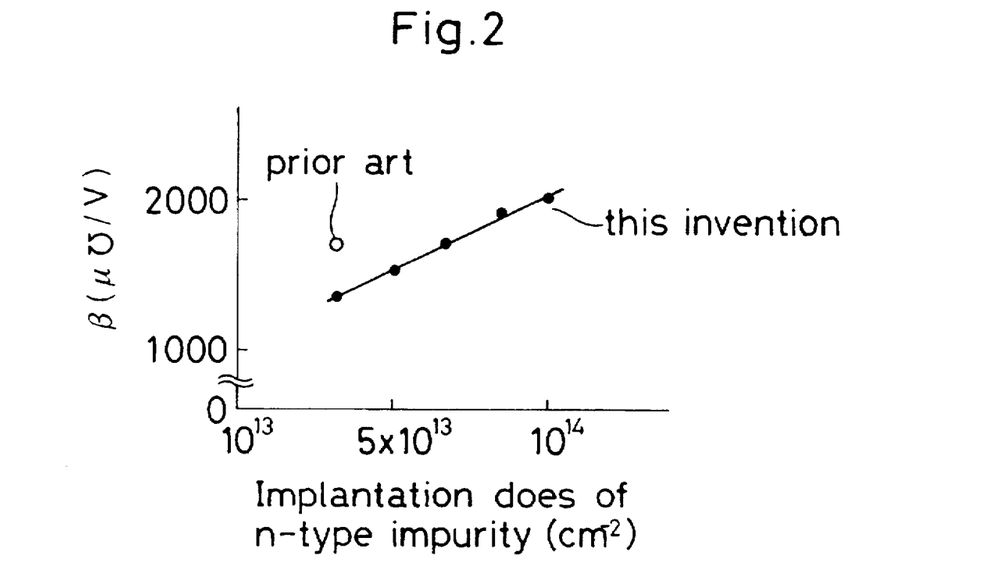
FIG. 2 is a diagram showing a relationship between the dose of implanted n-type impurity and the β value of the n-MOS transistor of a semiconductor device obtained by the method according to the present invention.

FIG. 2 shows a relationship between the dose of n-type impurity implanted for forming the low concentration n-type impurity region 14 and the β value which is an operative power of the n-MOS transistor in the n-MOS region into which the p-type impurity has been implanted in accordance with the above Example. FIG. 2 shows that, if the amount of implanted n-type impurity is about the same as that of the prior art which employs forming a mask pattern in the n-MOS region for preventing the p-type impurity from being implanted into the n-MOS region, the β value is lower than that of the prior art because the p-type impurity has been implanted. However, the β value increases as the amount of implanted n-type impurity is increased. Also, it is shown that the extra amount of n-type impurity should be about the same as that of the previously implanted p-type impurity so as to cancel the p-type impurity region and to obtain the same β value as that of the prior art.

Figure 3:
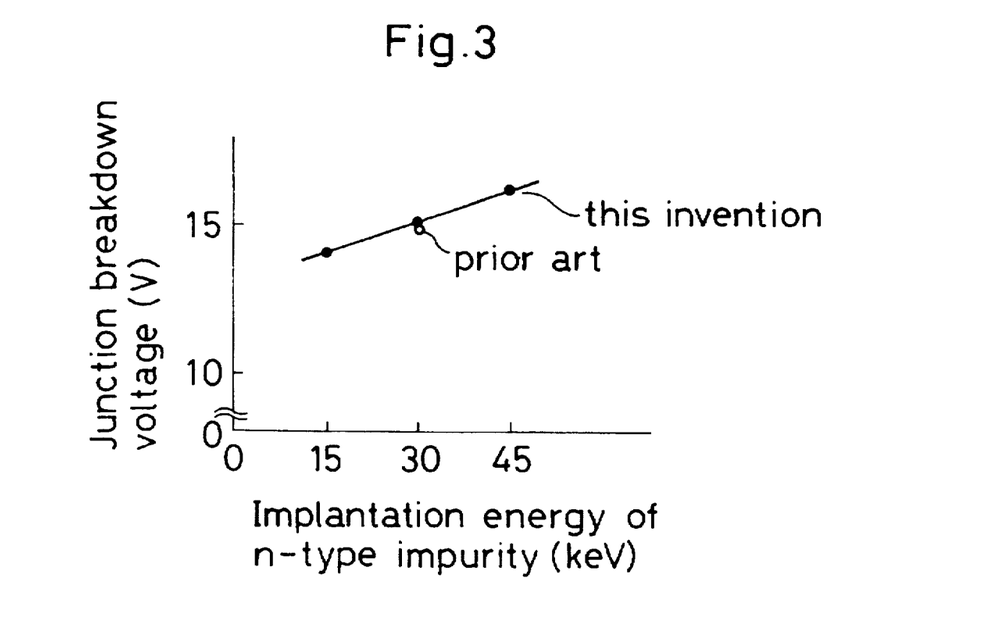
FIG. 3 is a diagram showing a relationship between the implanting energy of the n-type impurity and the junction breakdown voltage of a semiconductor device obtained by the method according to the present invention.

FIG. 3 shows a relationship between the junction breakdown voltage and the implanting energy of the low concentration n-type impurity in the n-MOS region of the peripheral circuit region into which the p-type impurity has been implanted at an energy of 30 keV in accordance with the above Example. FIG. 3 shows the following. If the implanting energy of the n-type impurity is less than about 30 keV, the n-type impurity region will be formed inside the p-type impurity region, so that the junction breakdown voltage will be lower than that of the prior art. If the implanting energy of the n-type impurity is more than 30 keV, the n-type impurity region will be formed deeper than the p-type impurity region, so that the junction breakdown voltage will increase. Therefore, it is shown that the n-type impurity should be implanted to approximately the same depth as that of the above p-type impurity region so as to cancel the p-type impurity region and to obtain the same junction breakdown voltage as that of the prior art.

Figure 4:
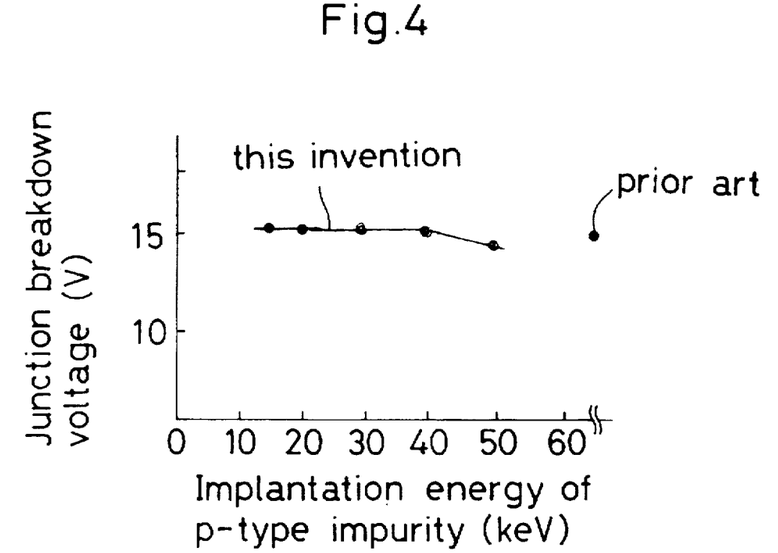
FIG. 4 is a diagram showing a relationship between the implanting energy of the p-type impurity and the junction breakdown voltage of a semiconductor device obtained by the method according to the present invention.

FIG. 4 shows a relationship between the junction breakdown voltage and the implanting energy of the p-type impurity in the n-MOS region of the peripheral circuit region into which the low concentration n-type impurity is implanted at an energy of 30 kev. FIG. 4 shows that, if the implanting energy of the p-type impurity is large, the p-type impurity region is formed deeper than the n-type impurity region, so that the junction breakdown voltage will be lower than a case of the prior art in which the p-type impurity is not implanted.

Therefore, it is understood that, in addition to the amount conventionally needed, an extra amount of n-type impurity (the extra amount being about the same as that of the implanted p-type impurity) must be implanted to a depth equal to or more than that of the p-type impurity region in order to cancel the p-type impurity implanted also into the n-MOS region of the peripheral circuit region by the ion implantation of p-type impurity into the entire surface of the semiconductor substrate for forming the device isolation region in the above memory cell region and to prevent degradation of the device properties.

Moreover, by the implantation of the p-type impurity into the entire surface of the semiconductor substrate, the p-type impurity is also implanted into the p-MOS region of the peripheral circuit region, thereby forming low concentration source/drain regions of the transistor in the p-MOS region. Thus, a p-MOS transistor having an LDD structure is formed, so that the steps of forming a mask pattern which is open at the p-MOS region and implanting a low concentration p-type impurity are no longer necessary. Also, even if the p-MOS transistor is to have source/drain regions without an LDD structure, the introduction of the p-type impurity into the p-MOS region will have no adverse effects on the transistor characteristics because the concentration of the p-type impurity is low and the conductivity type thereof is the same as that of the impurity later implanted to form high concentration source/drain regions.

Although the Example has been given for a case in which the peripheral circuit region of a masked ROM comprises a CMOS, the present invention is applicable to the cases in which the peripheral circuit region comprises only an n-MOS region or a p-MOS region. However, due to the need for high speed operation, it is preferable to use an n-MOS.

The method for manufacturing a semiconductor device according to the present invention lowers the production costs, improves the yield, and shortens the turn-around-time by simplification of the steps for manufacturing a semiconductor device having a flat-cell-type memory region and a peripheral circuit region comprising a CMOS, an n-MOS or a p-MOS.

What we claim is:

1. A method for manufacturing a semiconductor device comprising a first conductivity type semiconductor substrate, a memory cell region formed on the substrate, the memory cell region having a plurality of second conductivity type transistors, and a peripheral circuit region formed on the substrate, the peripheral circuit region having at least a plurality of second conductivity type transistors, which comprises the steps of:

(i-a) forming source/drain regions in a memory cell formation region on the semiconductor substrate by implanting a second conductivity type impurity, (ii-a) forming a gate insulating film and gate electrodes on the memory cell formation region and a peripheral circuit formation region of the semiconductor substrate, thereby providing the plurality of second conductivity type transistors in the memory cell formation region, (iii-a) implanting a first conductivity type impurity into the entire surface of the semiconductor substrate with the gate electrodes used as a mask to form a device isolation region in the memory cell formation region and, at the same time, to allow the first conductivity type impurity to be contained to a predetermined depth in a second conductivity type transistor formation region of the peripheral circuit formation region, and (iv-a) forming a mask pattern on the memory cell formation region for masking the memory cell formation region, and implanting a second conductivity type impurity to a predetermined implantation depth into the second conductivity type transistor formation region of the peripheral circuit formation region with the mask pattern and the gate electrode used as a mask to form second conductivity type source/drain regions, thereby providing the plurality of second conductivity type transistors in the second conductivity type transistor formation region of the peripheral circuit formation region.

2. A method for manufacturing a semiconductor device as set forth in claim 1, wherein in the step (iv-a), the second conductivity type impurity is implanted under a condition in which the second conductivity type impurity cancels the first conductivity type impurity implanted in the step (iii-a) and which is sufficient to form the second conductivity type source/drain regions.

3. A method for manufacturing a semiconductor device as set forth in claim 2, wherein, in the step (iv-a), the second conductivity type impurity is implanted in a dose which is larger than a dose of the first conductivity type impurity implanted in the step (iii-a) and is sufficient to form the second conductivity type source/drain regions.

4. A method for manufacturing a semiconductor device as set forth in claim 3, wherein, in the step of (iii-a), the first conductivity type impurity is implanted in a dose of about $1 \times 10^{12}$ to $1 \times 10^{14}$ cm$^{-2}$ and, in the step of (iv-a), the second conductivity type impurity is implanted in a dose of $2 \times 10^{12}$ to $2 \times 10^{14}$ cm$^{-2}$.

5. A method for manufacturing a semiconductor device as set forth in claim 1, further comprising, after the step of (iii-a) and (iv-a) followed by removal of the mask pattern, the step of:

(v-a) forming sidewall spacers on the side walls of the gate electrodes, forming a mask pattern on the memory cell formation region for masking the memory cell formation region, and implanting second conductivity type impurity into the second conductivity type source/drain regions of the second conductivity type transistor formation region of the peripheral circuit formation region with the mask pattern, the gate electrodes and the sidewall spacers used as a mask to provide the second conductivity type source/drain regions with LDD structure.

6. A method for manufacturing a semiconductor device as set forth in claim 2, further comprising, after the step of (iii-a) and (iv-a) followed by removal of the mask pattern, the step of:

(v-a) forming sidewall spacers on the side walls of the gate electrodes, forming a mask pattern on the memory cell formation region for masking the memory cell formation region, and implanting second conductivity type impurity into the second conductivity type source/drain regions of the second conductivity type transistor formation region of the peripheral circuit formation region with the mask pattern, the gate electrodes and the sidewall spacers used as a mask to provide the second conductivity type source/drain regions with LDD structure.

7. A method for manufacturing a semiconductor device comprising a semiconductor substrate having first and second conductivity type regions formed therein, a memory cell region formed on the substrate, the memory cell region having a plurality of second conductivity type transistors, and a peripheral circuit region formed on the substrate, the peripheral circuit region having a plurality of first conductivity type transistors, which comprises the steps of:

(i-b) forming source/drain regions in a memory cell formation region on the semiconductor substrate by implanting a second conductivity type impurity, (ii-b) forming a gate insulating film and gate electrodes on the memory cell formation region and on a peripheral circuit formation region of the semiconductor substrate thus obtained, thereby providing the plurality of second conductivity type transistors in the memory cell formation region, (iii-b) implanting a first conductivity type impurity into the entire surface of the semiconductor substrate with the gate electrode used as a mask to form a device isolation region in the memory cell formation region and to form a first conductivity type impurity region in at least a first conductivity type transistor formation region of the peripheral circuit formation region.

8. A method for manufacturing a semiconductor device as set forth in claim 7, wherein, in the step of (iii-b), the first conductivity type impurity is implanted in a dose of $1 \times 10^{12}$ to $1 \times 10^{14}$ cm$^{-2}$.

9. A method for manufacturing a semiconductor device as set forth in claim 7, wherein the peripheral circuit region further comprises a plurality of second conductivity type transistors, and the step (iii-b) comprises further steps of:

(a) forming a mask pattern on a second conductivity type transistor formation region of the peripheral circuit formation region before implanting the first conductivity type impurity, and (b) forming a mask pattern which is open only at the second conductivity type transistor formation region of the peripheral circuit formation region and implanting a second conductivity type impurity into the semiconductor substrate with the mask pattern and the gate electrodes used as a mask to form a second conductivity type impurity region in the second conductivity type transistor formation region of the peripheral circuit formation region.

10. A method for manufacturing a semiconductor device as set forth in claim 9, wherein, in the step of (iii-b), the first conductivity type impurity is implanted in a dose of about $1 \times 10^{12}$ to $1 \times 10^{14}$ cm$^{-2}$, and, in the step of (b), the second conductivity type impurity is implanted in a dose of $2 \times 10^{12}$ to $2 \times 10^{14}$ cm$^{-2}$.

11. A method for manufacturing a semiconductor device as set forth in claim 9, further comprising the steps of:

(iv-b) forming side wall spacers on the side walls of the gate electrodes, (v-b) (d) forming a mask pattern which is open only at the first conductivity type transistor formation region of the peripheral circuit formation region and implanting a first conductivity type impurity with the mask pattern, the gate electrodes and the sidewall spacers used as a mask into the first conductivity type impurity region of the first conductivity type transistor formation region of the peripheral circuit formation region, to provide the first conductivity type source/drain regions with LDD structure and (e) forming a mask pattern which is open only at the second conductivity type transistor formation region of the peripheral circuit formation region and implanting a second conductivity type impurity with the mask pattern, the gate electrodes and the sidewall spacers used as a mask into the second conductivity type impurity region of the second conductivity type transistor formation region of the peripheral circuit formation region to provide the second conductivity type source/drain regions with LDD structure, thereby providing the plurality of first and second conductivity type transistors in the peripheral circuit formation region.

12. A method for manufacturing a semiconductor device as set forth in claim 7, wherein the peripheral circuit region further comprises a second conductivity type transistor, and the step (iii-b) allows the first conductivity type impurity to be contained to a predetermined depth in a second conductivity type transistor formation region of the peripheral circuit region simultaneously with the implantation of the first conductivity type impurity, and the step (iii-b) comprises a further step of:

(c) forming a mask pattern which is open only at the second conductivity type transistor formation region of the peripheral circuit formation region and, implanting a second conductivity type impurity into the semiconductor substrate with the mask pattern and the gate electrodes used as a mask to form a second conductivity type impurity region in the second conductivity type transistor formation region of the peripheral circuit formation region.

13. A method for manufacturing a semiconductor device as set forth in claim 12, wherein in the step (iii-b)(c), the second conductivity type impurity is implanted under a condition in which the second conductivity type impurity cancels the first conductivity type impurity implanted in the step (iii-b) and which is sufficient to form the second conductivity type source/drain regions.

14. A method for manufacturing a semiconductor device as set forth in claim 12, wherein, in the step (iii-b)(c), the second conductivity type impurity is implanted in a dose which is larger than a dose of the first conductivity type impurity for the implantation in the step (iii-b) and is sufficient to form the second conductivity type source/drain regions.

15. A method for manufacturing a semiconductor device as set forth in claim 12, further comprising the steps of:

(iv-b) forming side wall spacers on the side walls of the gate electrodes, (v-b) (d) forming a mask pattern which is open only at the first conductivity type transistor formation region of the peripheral circuit formation region and implanting a first conductivity type impurity with the mask pattern, the gate electrodes and the sidewall spacers used as a mask into the first conductivity type impurity region of the first conductivity type transistor formation region of the peripheral circuit formation region to provide the first conductivity type source/drain regions with LDD structure, and (e) forming a mask pattern which is open only at the second conductivity type transistor formation region of the peripheral circuit formation region and implanting a second conductivity type impurity with the mask pattern, the gate electrodes and the sidewall spacers used as a mask into the second conductivity type impurity region of the second conductivity type transistor formation region of the peripheral circuit formation region to provide the second conductivity type source/drain regions with LDD structure, thereby providing the plurality of first and second conductivity type transistors in the peripheral circuit formation region.

* * * * *